(12) United States Patent
Kihara et al.

(10) Patent No.: US 6,879,099 B2
(45) Date of Patent: Apr. 12, 2005

(54) ORGANIC EL ELEMENT AND ORGANIC EL DISPLAY

(75) Inventors: Naoko Kihara, Matsudo (JP); Yasushi Mori, Yokohama (JP); Katsuyuki Naito, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/819,283

(22) Filed: Apr. 7, 2004

(65) Prior Publication Data

US 2004/0189194 A1 Sep. 30, 2004

Related U.S. Application Data

(63) Continuation of application No. PCT/JP03/07498, filed on Jun. 12, 2003.

(30) Foreign Application Priority Data

Jul. 10, 2002 (JP) ........................................ 2002-201129

(51) Int. Cl.$^7$ .............................. H01J 1/62; H01J 63/04
(52) U.S. Cl. ........................................ 313/504; 313/506
(58) Field of Search ............................. 313/504, 506, 313/498, 500; 428/690

(56) References Cited

U.S. PATENT DOCUMENTS

| | | | |
|---|---|---|---|
| 6,476,988 B1 | | 11/2002 | Yudasaka |
| 6,573,650 B2 | * | 6/2003 | Aoki et al. ............... 313/503 |
| 2002/0024096 A1 | * | 2/2002 | Yamakazi et al. ........ 257/359 |
| 2002/0060518 A1 | * | 5/2002 | Duineveld et al. ....... 313/506 |
| 2002/0063515 A1 | * | 5/2002 | Goto ........................ 313/500 |
| 2003/0137242 A1 | | 7/2003 | Seki |

FOREIGN PATENT DOCUMENTS

| | | |
|---|---|---|
| JP | 11-329741 | 11/1999 |
| JP | 2000-323276 | 11/2000 |
| JP | 2001-288416 | 10/2001 |
| JP | 2003-249375 | 9/2003 |
| WO | WO 99/48338 | 9/1999 |

OTHER PUBLICATIONS

Hubert Spreitzer et al., "Soluble Phenyl–Substituted PPVs–New Materials for Highly Efficient Polymer LEDs," Advanced Materials, 1998, No. 16, pp. 1340–1343 no month.

Gerrit Klärner et al., "Colorfast Blue–Light–Emitting Random Copolymers Derived from Di–n–hexylfluorene and Anthracene," Advanced Materials, 1998, No. 13, pp. 993–997 no month.

U.S. Appl. No. 10/395,253, filed Mar. 25, 2003, Katsuyuki Naito.

* cited by examiner

Primary Examiner—Joseph Williams
Assistant Examiner—Peter Macchiarolo
(74) Attorney, Agent, or Firm—Pillsbury Winthrop LLP

(57) ABSTRACT

Provided is an organic EL display including a substrate, anodes arranged on one major surface of the substrate, an insulating separator layer covering the major surface of the substrate and having through-holes in the positions of the anodes, organic emitting layers disposed on the anodes, buffer layers disposed between the anodes and the organic emitting layers, and a cathode covering the organic emitting layers, wherein a central portion of each of the buffer layers is thicker than its periphery.

20 Claims, 3 Drawing Sheets

ORGANIC EL ELEMENT AND ORGANIC EL DISPLAY

CROSS-REFERENCE TO RELATED APPLICATIONS

This is a Continuation Application of PCT Application No. PCT/JP03/07498, filed Jun. 12, 2003, which was not published under PCT Article 21(2) in English.

This application is based upon and claims the benefit of priority from prior Japanese Patent Application No. 2002-201129, filed Jul. 10, 2002, the entire contents of which are incorporated herein by reference.

BACKGROUND OF THE INVENTION

1. Field of the Invention

The present invention relates to a light-emitting element and display and, more particularly, to an organic EL (Electro-Luminescence) element and organic EL display.

2. Description of the Related Art

A liquid crystal display is one of flat panel displays that are presently generally used. This liquid crystal display has the problems that, e.g., the viewing angle is narrow, the power consumption is large because a backlight is necessary, the backlight increases the thickness of the display, and the response time is slow.

To solve these problems, various attempts have been proposed. However, it is difficult for the liquid crystal display to solve the above problems.

For example, to solve the problem of the viewing angle, wide viewing angle technologies using a multi-domain method are proposed. However, the technologies increase the number of steps and hence increase the cost. Although a compensating plate can be adhered on the display surface, no sufficient viewing angle can be obtained. In addition, an MVA (Multi-domain Vertical Aligned nematic) display method is proposed to solve the problems of both the viewing angle and response time. Unfortunately, this method has the problem of reliability of, e.g., image burn.

On the other hand, the approach to low power consumption has been done by the development of liquid crystal materials and driving circuits. However, the power consumption cannot be unlimitedly reduced by these methods.

Recently, an organic EL display is attracting attention as a display capable of solving these problems. Since the organic EL display is a display in which pixels themselves emit light, the viewing angle is wide, and the response time is short. Also, a low profile and light weight are possible because no backlight is necessary.

In the process of manufacturing the organic EL display, an organic emitting layer is formed by vacuum evaporation when a low-molecular organic material is used as the material of the layer. When a high-molecular organic material is used as the material of this organic emitting layer, the organic emitting layer is formed by drying a coating film obtained by using a solution containing this high-molecular organic material.

In the latter method, an insulating film having through-holes in one-to-one correspondence with pixels is first formed on a substrate. Then, these through-holes are used as liquid reservoirs and filled with a solution containing the high-molecular organic material by using a solution coating method such as dipping, inkjet, or spin coating. After that, the solvent is removed from the liquid film in the through-holes by drying the liquid film. In this manner, an organic emitting layer is obtained.

In this method, the film thickness uniformity of the organic emitting layer is affected by, e.g., the wettability of the insulating film used as a liquid reservoir with respect to the solution, the surface tension and viscosity of the solution, and the drying characteristics of the solvent. As a consequence, the film thickness of each organic emitting layer becomes uneven. Light emission of the organic emitting layer occurs by recombination of electric charges injected into the organic emitting layer. Therefore, in an organic emitting layer having an uneven film thickness, an electric current concentrates to a thin portion. This current concentration leads to early partial deterioration in a pixel, and shortens the emission life of the display.

BRIEF SUMMARY OF THE INVENTION

It is an object of the present invention to provide an organic EL element and organic EL display capable of suppressing local current concentration to a portion of an organic emitting layer.

According to the first aspect of the present invention, there is provided an organic EL display comprising a substrate, anodes arranged on one major surface of the substrate, an insulating separator layer covering the major surface of the substrate and having through-holes in positions of the anodes, organic emitting layers disposed on the anodes, buffer layers disposed between the anodes and the organic emitting layers, and a cathode covering the organic emitting layers, wherein a central portion of each of the buffer layers is thicker than a periphery thereof.

According to the second aspect of the present invention, there is provided an organic EL element comprising an anode, a cathode facing the anode, an organic emitting layer disposed between the anode and cathode, and a buffer layer disposed between the anode and organic emitting layer, a central portion of the buffer layer being thicker than a periphery thereof.

DETAILED DESCRIPTION OF THE INVENTION

Figure 1:
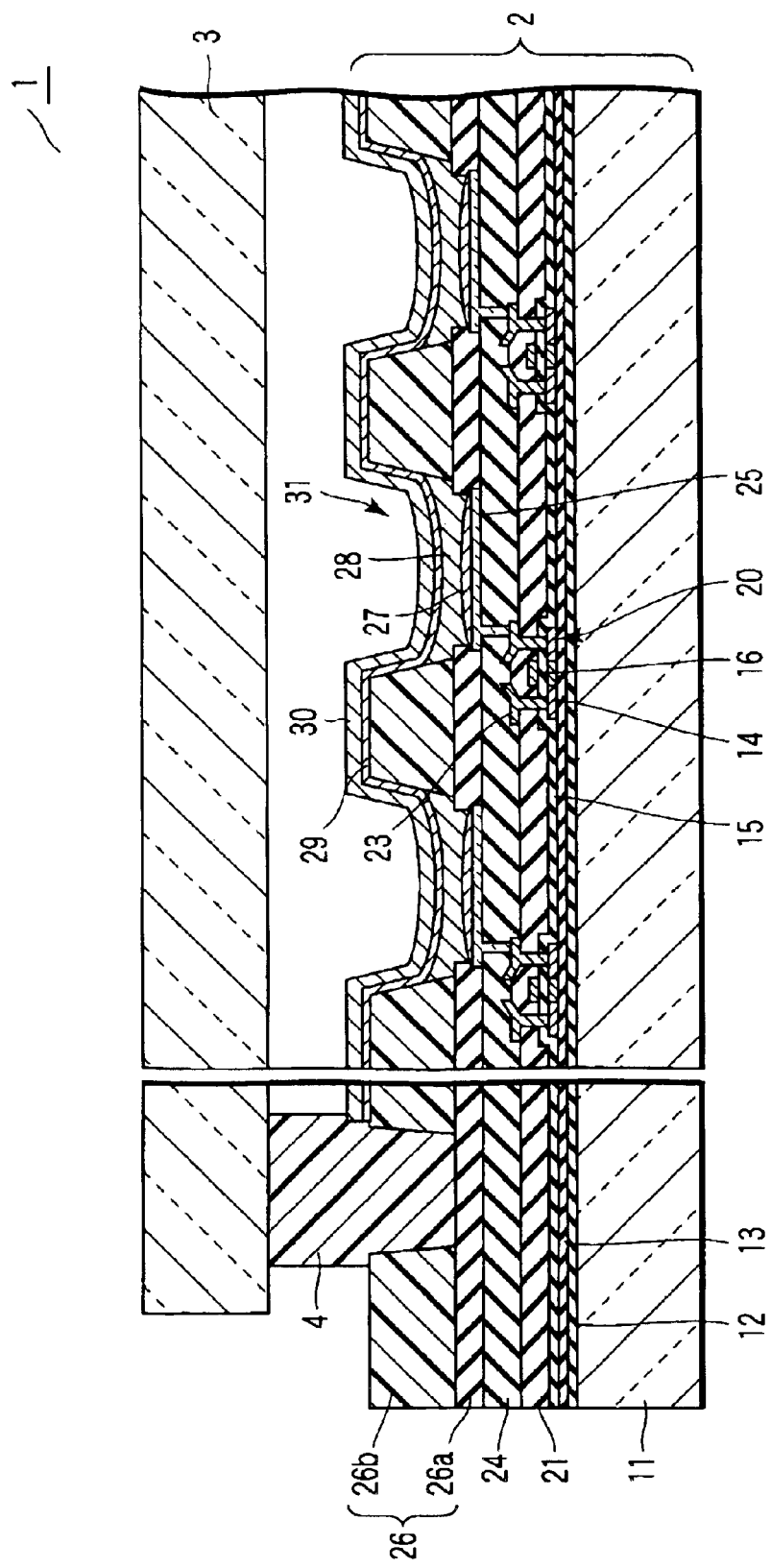
FIG. 1 is a sectional view schematically showing an organic EL display according to an embodiment of the present invention.

An embodiment of the present invention will be described in detail below with reference to the accompanying drawings. The same reference numerals denote the same or similar parts in the drawings, and a repetitive explanation thereof will be omitted.

FIG. 1 is a sectional view schematically showing an organic EL display according to an embodiment of the present invention. An organic EL display 1 shown in FIG. 1 has a structure in which an array substrate 2 and sealing substrate 3 are opposed via a seal layer 4. The seal layer 4 is formed along the periphery of the sealing substrate 3, thereby forming a closed space between the array substrate 2 and sealing substrate 3. This space is filled with, e.g., a rare gas such as Ar gas or an inert gas such as $N_2$ gas.

The array substrate 2 has a substrate 11. On the substrate 11, an $SiN_2$ layer 12 and $SiO_2$ layer 13 are stacked in this order as undercoating layers. On the undercoating layer 13, semiconductor layers 14 such as polysilicon layers in each of which channel, source, and drain are formed, a gate insulating film 15, and gate electrodes 16 are stacked in this order, thereby forming top gate type thin-film transistors (to be referred to as TFTs hereinafter) 20.

A dielectric interlayer 21 made of $SiO_2$ or the like is formed on the gate insulating film 15 and gate electrodes 16. On the dielectric interlayer 21, electrode interconnections (not shown) and source and drain electrodes 23 are formed and embedded in a passivation film 24 made of $SiN_x$ or the like. The source and drain electrodes 23 are electrically connected to the sources and drains of the TFTs 20 through contact holes formed in the dielectric interlayer 21.

On the passivation film 24, transparent pixel electrodes (anodes) 25 and an insulating separator layer 26 are formed. The insulating separator layer 26 has a structure in which a hydrophilic insulating layer 26a and water-repellent insulating layer 26b are stacked in this order. Also, holes are formed in the insulating separator layer 26 in one-to-one correspondence with the pixel electrodes 25.

On each pixel electrode 25 exposed in the hole of the insulating separator layer 26, a buffer layer 27 and organic emitting layer 28 are stacked in this order. The buffer layer 27 mediates injection of holes from the pixel electrode 25 to the organic emitting layer 28. The organic emitting layer 28 is a thin film containing a red, green, or blue luminescence organic compound.

On the insulating separator layer 26 and light-emitting layers 28, a common electrode (cathode) 29 and protective electrode 30 are stacked in this order. The electrodes 29 and 30 are electrically connected to electrode interconnections through contact holes (not shown) formed in the passivation film 24 and insulating separator layer 26. Each organic EL emitting element 31 is made up of the anode 25, buffer layer 27, light-emitting layer 28, and cathode 29.

The light-emitting layer 28 of the organic EL display 1 described above can be formed by a solution coating method using a solution which contains an organic solvent and luminescence organic compound. Since this solution is a low-polarity solution, the water-repellent insulating layer 26b exhibits high wettability with respect to it. Therefore, as shown in FIG. 1, the central portion of the light-emitting layer 28 formed by this solution coating method is thinner than its periphery. If a voltage is uniformly applied to the light-emitting layer 28 having this uneven film thickness, current concentration occurs in its central portion. Consequently, the luminance of each pixel becomes nonuniform, and the life of the central portion becomes much shorter than that of the periphery.

In the organic EL display 1 according to this embodiment, the central portion of the buffer layer 27 is thicker than its periphery. The buffer layer 27 can be regarded as a resistor connected in series between the anode 25 and light-emitting layer 28, and the resistance of this resistor increases as the thickness of the buffer layer 27 increases. Accordingly, when the buffer layer 27 has the film thickness profile described above, the voltage applied to the central portion of the light-emitting layer 28 can be made smaller than the voltage applied to its periphery. As a consequence, current concentration to the central portion of the light-emitting layer 28 can be suppressed. That is, it is possible to prevent the luminance of each pixel from becoming nonuniform, and realize a long emission life by preventing the life of the central portion from becoming much shorter than that of the periphery.

The organic EL display 1 described above can be manufactured by, e.g., the following method.

Figure 2A:
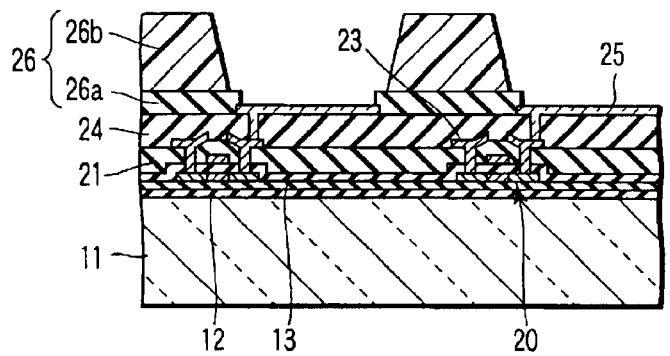
FIGS. 2A to 2D are sectional views schematically showing an example of a method of manufacturing the organic EL display shown in FIG. 1.

FIGS. 2A to 2D are sectional views schematically showing an example of the method of manufacturing the organic EL display 1 shown in FIG. 1. In this method, a structure shown in FIG. 2A is first obtained. In this structure shown in FIG. 2A, anodes 25 are arranged in a matrix manner on one major surface of a substrate 11. An insulating separator layer 26 made up of insulating layers 26a and 26b covers the gaps between adjacent anodes 25 and the periphery of each anode 25, on the surface of the substrate 11 on which the anodes 25 are formed. Through-holes are formed in the insulating separator layer 26 in one-to-one correspondence with the anodes 25, and the bottom surface of each through-hole is formed by the central portion of the anode 25. That is, the insulating separator layer 26 forms liquid reservoirs each having the central portion of the anode 25 as its bottom surface.

Figure 2B:
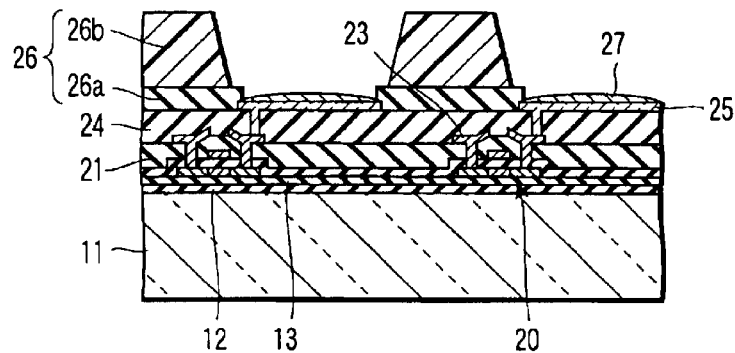

Next, as shown in FIG. 2B, buffer layers 27 are formed by a solution coating method, e.g., an inkjet method.

When the buffer layers 27 are formed by using a solution having sufficiently high polarity, a film obtained using this solution tends to have a small contact area with the hydrophobic insulating layer 26b. Accordingly, buffer layers 27 each having a central portion thicker than its periphery can be obtained by controlling the surface tension and viscosity of the solution used, and the drying characteristics of the organic solvent.

Figure 2C:
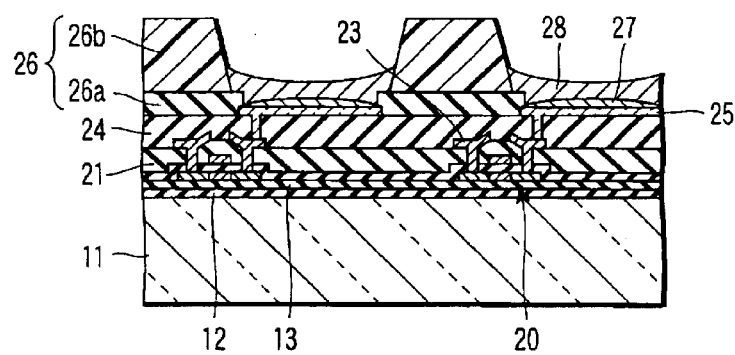

Subsequently, as shown in FIG. 2C, light-emitting layers 28 are formed by a solution coating method, e.g., an inkjet method. Evaporation of the solvent from the liquid film in each pixel progresses from the periphery, so the solid component of the liquid film moves to the periphery. In this way, light-emitting layers 28 each having a central portion thinner than its periphery are obtained.

Figure 2D:
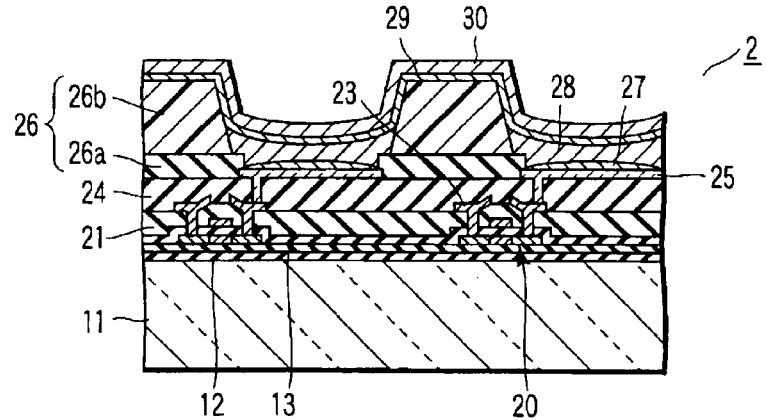

After that, as shown in FIG. 2D, a cathode 29 and protective electrode 30 are formed in this order by evaporation. An array substrate 2 is completed as described above.

In addition, a seal layer 4 is formed on the periphery of the opposing surfaces of the array substrate 2 and/or a sealing substrate 3. Subsequently, the substrates 2 and 3 are adhered in an inert gas to obtain an organic EL display 1 shown in FIG. 1.

Materials usable as the main components of the organic EL display 1 according to this embodiment will be described below.

Any material can be used as the substrate 11, provided that the material can hold the structure formed on it. The substrate 11 is generally a hard substrate such as a glass substrate. However, a flexible substrate such as a plastic sheet may also be used depending on the application of the organic EL display 1.

When the organic EL display 1 is a bottom emission type display which emits light from the substrate 11, transparent electrodes having light transmittance are used as the anodes 25. As the material of this transparent electrode, a transparent conductive material such as ITO (Indium Tin Oxide) can be used. The film thickness of the transparent electrode is normally about 10 to 150 nm. The transparent electrode can be obtained by depositing the transparent conductive material by, e.g., evaporation or sputtering, and patterning the obtained thin film by photolithography.

The insulating separator layer 26 can have either a single-layered structure or multilayered structure. For example, the insulating separator layer 26 can be formed by the insulating layer 26b alone. However, when the insulating separator layer 26 is made up of the insulating layers 26a and 26b, the buffer layers 27 and light-emitting layers 28 can be easily formed into the shapes mentioned earlier.

As the material of the insulating layer 26a, it is possible to use, e.g., an inorganic insulating material such as silicon nitride or silicon oxide. The insulating layer 26a made of any of these inorganic insulating materials has relatively high hydrophilic nature.

The diameter of the opening, facing the insulating layer 26b, of each through-hole formed in the insulating layer 26a is desirably smaller than the diameter of the opening, facing the insulating layer 26a, of each through-hole formed in the insulating layer 26b. This is advantageous in increasing the adhesion of the light-emitting layer 28.

As the material of the insulating layer 26b, an organic insulating material or the like can be used. This organic insulating material usable as the insulating layer 26b is not particularly limited. However, when a photosensitive resin is used, an insulating layer 26b having through-holes can be easily formed. An example of the photosensitive resin which can be used to form the insulating layer 26b is a material which is obtained by adding a photosensitive compound such as naphthoquinonediazide to an alkalisoluble high-molecular derivative such as phenolic resin, polyacryl, polyamide resin, or polyamic acid, and which gives a positive pattern by exposure and alkali development. A photosensitive resin which gives a negative pattern is a photosensitive resin which decreases the rate of dissolution in a developer by actinic irradiation. An example is a photosensitive resin having a functional group, such as an epoxy group, which crosslinks by actinic irradiation. For example, the insulating layer 26b can be obtained by coating the surface of the substrate 11, on which the anodes 25 are formed, with the photosensitive resin by spin coating or the like, and patterning the obtained coating film by using photolithography.

Normally, the film thickness of the insulating separator layer 26 is desirably the sum of the film thicknesses of the buffer layer 27 and light-emitting layer 28 or more, and preferably, about 1 to 3 $\mu$m. Also, before the buffer layers 27 and light-emitting layers 28 are formed, the surface of the insulating layer 26b is desirably made water-repellent by a plasma gas of $CF_4.O_2$ and the like, in order to increase the positional accuracy during solution coating by an inkjet method.

As the material of the buffer layer 27, it is possible to use, e.g., a mixture of a donor high-molecular organic compound and acceptor high-molecular organic compound as a water-soluble conductive polymer. It is particularly favorable to use a polythiophene derivative such as polyethylenedioxythiophene and/or a polyaniline derivative such as polyaniline as the donor high-molecular organic compound, and polystyrenesulfonic acid as the acceptor organic compound. When these materials are used, a composition distribution in which the resistivity of the central portion of the buffer layer 27 is higher than that of its periphery can be produced in the buffer layer 27 by appropriately setting the film formation conditions.

For example, when polyethylenedioxythiophene (to be referred to as PEDOT hereinafter) and polystyrenesulfonic acid (to be referred to as PSS hereinafter) are used as the materials of the buffer layer 27, the PSS concentration in the central portion of the buffer layer 27 can be made higher than that in its periphery by appropriately setting the type of solvent, the molecular weights of PEDOT and PSS, the weight ratio of PEDOT to PSS, and the drying conditions. The conductivity of the mixture of PEDOT and PSS often decreases as the PSS concentration increases. Therefore, when the above-mentioned composition distribution is produced, the resistivity of the central portion of the buffer layer 27 can be made higher than that of its periphery. That is, the aforementioned effect can be amplified in connection with the film thickness profile of the buffer layer 27.

This composition distribution is presumably produced by phase separation between PEDOT and PSS in the coating film drying process. Accordingly, this composition distribution can be produced in the buffer layer 27 by appropriately setting the composition of the solution used to form the buffer layer 27 and the drying conditions of the coating film.

When the mixture of PEDOT and PSS is to be used as the material of the buffer layer 27, the molecular weight of PEDOT is preferably smaller than that of PSS. Also, the PEDOT concentration is preferably lower than the PSS concentration. This is advantageous in producing the above composition distribution.

As described above, the buffer layers 27 are obtained by filling, by a solution coating method, the liquid reservoirs formed by the insulating separator layer 26 with the solution prepared by dissolving the mixture of the donor high-molecular organic compound and acceptor high-molecular organic compound in an organic solvent, and removing the solvent from the liquid films in the liquid reservoir by drying the liquid films. Examples of the solution coating method which can be used to form the buffer layers 27 are dipping, inkjet, and spin coating. Of these methods, the inkjet method is particularly favorable. Also, the liquid film can be dried under heating and/or reduced pressure, or by natural drying.

In this embodiment as described above, current concentration to the central portion of the light-emitting layer 28 is suppressed by making the buffer layer 27 thick in its central portion and thin in its periphery. This effect can be obtained if the central portion of the buffer layer 27 is thicker than its periphery. The effect can be obtained most notably when that central portion of the buffer layer 27, which suppresses current concentration to the central portion of the light-emitting layer 28, is thicker by about 10 nm or more than the periphery of the buffer layer 27.

The film thickness of the periphery of the buffer layer 27 is preferably about 1 nm or more. If the buffer layer 27 is excessively thin, partial lacking of a film of the buffer layer 27 easily occurs. Also, the film thickness of the central portion of the buffer layer 27 is preferably smaller than that of the insulating layer 26a, i.e., preferably about 100 nm or less. If the buffer layer 27 is excessively thick, the resistance of the buffer layer 27 increases, and this makes it difficult to well inject an electric current into the light-emitting layer 28.

As the material of the light-emitting layer 28, luminescence organic compounds generally used in organic EL displays can be used. Examples of an organic compound which emits red luminescence are a high-molecular compound having an alkyl or alkoxy substituent in a benzene ring of a polyvinylenestyrene derivative, and a high-molecular compound having a cyano group in a vinylene group of a polyvinylenestyrene derivative. An example of an organic compound which emits green luminescence is a polyvinylenestyrene derivative in which an alkyl, alkoxy, or aryl derivative substituent is introduced in a benzene ring. An example of an organic compound which emits blue luminescence is a polyfluorene derivative such as a copolymer of dialkylfluorene and anthracene. A low-molecular luminescence organic compound may also be added to any of these high-molecular luminescence organic compounds of the light-emitting layer 28.

As described previously, the light-emitting layers 28 are obtained by filling, by a solution coating method, the liquid reservoirs formed by the insulating separator layer 26 with the solution prepared by dissolving the luminescence organic compound in a solvent, and removing the solvent from the liquid films in the liquid reservoirs by drying the liquid films. Examples of the solution coating method which can be used to form the light-emitting layers 28 are dipping, inkjet, and spin coating. Of these methods, the inkjet method is particularly preferable. Also, the liquid film can be dried under heating and/or reduced pressure, or by natural drying.

The film thickness of the light-emitting layer 28 is properly set in accordance with the material used. Normally, the entire film thickness of the light-emitting layer 28 is 50 to 200 nm. When the light-emitting layer 28 is formed by the above method, the film thickness of the central portion of the light-emitting layer 28 is smaller than that of the periphery (the portion immediately above the periphery of the buffer layer 27) of the light-emitting layer 28. The difference between these film thicknesses changes in accordance with the composition of the solution used to form the light-emitting layer 28. Normally, the difference is 100 to 10 nm.

Examples of the material of the cathode 29 are barium and calcium. Examples of the material of the protective electrode 30 are silver and aluminum.

In the above embodiment, the anodes 25 are formed on the passivation film 24. However, the anodes 25 may also be formed on the dielectric interlayer 21, i.e., in the same plane as signal lines. Also, although the organic EL display 1 is a bottom emission type display in the above embodiment, it may also be a top emission type display. Furthermore, the life of elements can be prolonged by encapsulating a desiccant in the space between the array substrate 2 and opposing substrate 3 when the array substrate 2 is sealed by the opposing substrate 3. It is also possible to improve the heat radiation characteristics by filling a resin between the opposing substrate 3 and array substrate 2.

An example of the present invention will be explained below.

In this example, an organic EL display 1 shown in FIG. 1 was manufactured by the method shown in FIGS. 2A to 2D.

That is, first, film formation and patterning were repeated on the surface of a glass substrate 11, on which undercoating layers 11 and 12 were formed, in the same manner as the conventional TFT formation process, thereby forming TFTs 20, a dielectric interlayer 21, electrode interconnections (not shown), source and drain electrodes 23, and a passivation film 24.

On the passivation film 24, a 50-nm thick ITO film was formed by sputtering. Subsequently, this ITO film was patterned by photolithography to obtain anodes 25. The anodes 25 may also be formed by sputtering using mask.

Then, on the surface of the substrate 11 on which the anodes 25 were formed, a hydrophilic layer 26a having holes in one-to-one correspondence with light-emitting portions of pixels was formed. The thickness of the hydrophilic layer 26a was 0.1 $\mu$m. Also, each hole in the hydrophilic layer 26a had a circular shape 50 $\mu$m in diameter. Subsequently, the surface of the substrate 11 on which the anodes 25 were formed was coated with a photosensitive resin, and the obtained coating film was subjected to pattern exposure and development, thereby forming a water-repellent layer 26b having holes in one-to-one correspondence with the light-emitting portions of the pixels. The thickness of the water-repellent layer 26b was 3 $\mu$m, and each hole in the water-repellent layer 26b had a circular shape 58 $\mu$m in diameter.

In this manner, an insulating separator layer 26 in which the hydrophilic layer 26a and water-repellent layer 26b were stacked was obtained. That is, the structure shown in FIG. 2A was obtained. Note that the substrate 11 on which the insulating separator layer 26 was formed was subjected to a surface treatment using $CF_4/O_2$ plasma gas, thereby fluoriding the surface of the water-repellent layer 26b.

Then, in liquid reservoirs formed by the insulating separator 26, liquid films were formed by discharging buffer layer formation ink by an inkjet method. Subsequently, these liquid films were heated at a temperature of 120° C. for 3 min to obtain buffer layers 27. The structure shown in FIG. 2B was obtained in this way.

On the buffer layers 27 corresponding to red, green, and blue pixels, liquid films were formed by discharging red, green, and blue light-emitting layer formation ink liquids by the inkjet method. The red and green light-emitting layer formation ink liquids were prepared by synthesizing a PPV derivative by referring to reference 1 (Adv. Mater. 1998, 10, 1340), and dissolving this derivative at a concentration of 1% in tetralin. The blue light-emitting layer formation ink was prepared by synthesizing a derivative of dihexylfluorene and anthracene by referring to reference 2 (Adv. Mater. 1998, 10, 993), and dissolving this derivative at a concentration of 1% in tetralin. These liquid films were heated at a temperature of 90° C. for 1 hr to obtain light-emitting layers 28 each having a film thickness of 80 nm in its central portion. In this way, the structure shown in FIG. 2C was obtained.

As shown in FIG. 2D, a cathode 29 was formed to have a film thickness of 90 Å by evaporating barium as a cathode material in a vacuum of $10^{-7}$ Pa. Subsequently, a protective electrode 30 was formed to have a film thickness of 1,500 Å by evaporating aluminum on the cathode 29. As a consequence, a TFT array substrate 2 having 480×640×3 (R, G and B) pixels, i.e., a total of 920,000 pixels was completed.

After that, a seal layer 4 was formed by coating the periphery of one major surface of a glass substrate 3 with an ultraviolet-curing resin. Then, the glass substrate 3 and array substrate 2 were adhered in an inert gas such that the surface of the glass substrate 3 on which the seal layer 4 was formed and the surface of the array substrate 2 on which the protective electrode 30 was formed faced each other. Furthermore, the seal layer was cured by ultraviolet irradiation, thereby completing the organic EL display 1 shown in FIG. 1.

The buffer layer 27 and light-emitting layer 28 of the organic EL display 1 were observed with a sectional SEM. The results are shown in FIGS. 3 and 4.

Figure 3:
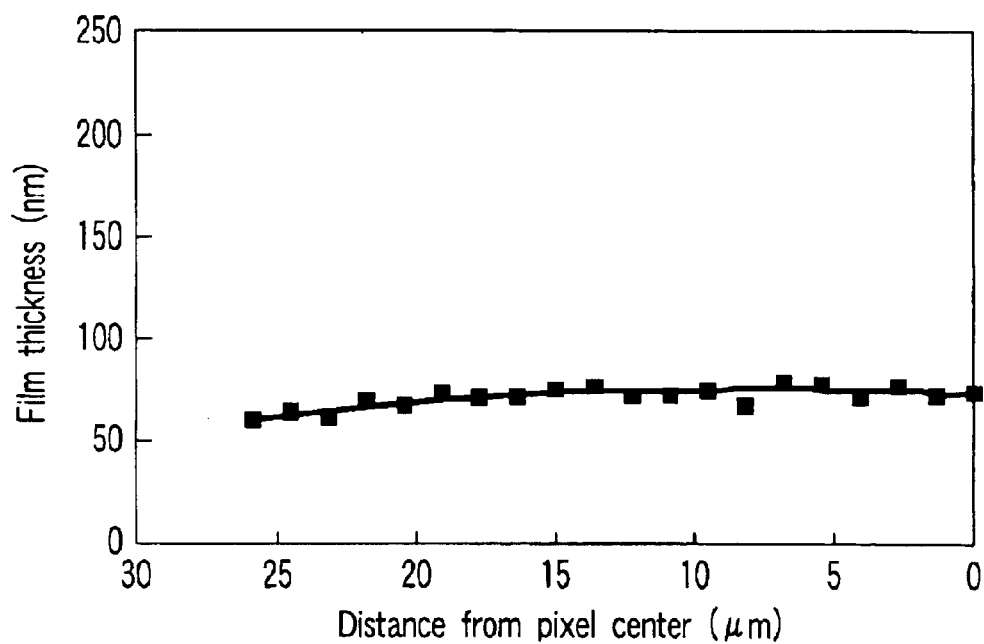
FIG. 3 is a graph showing the film thickness profile of a buffer layer obtained by observing a sectional SEM image of an organic EL display according to an example of the present invention.
Figure 4:
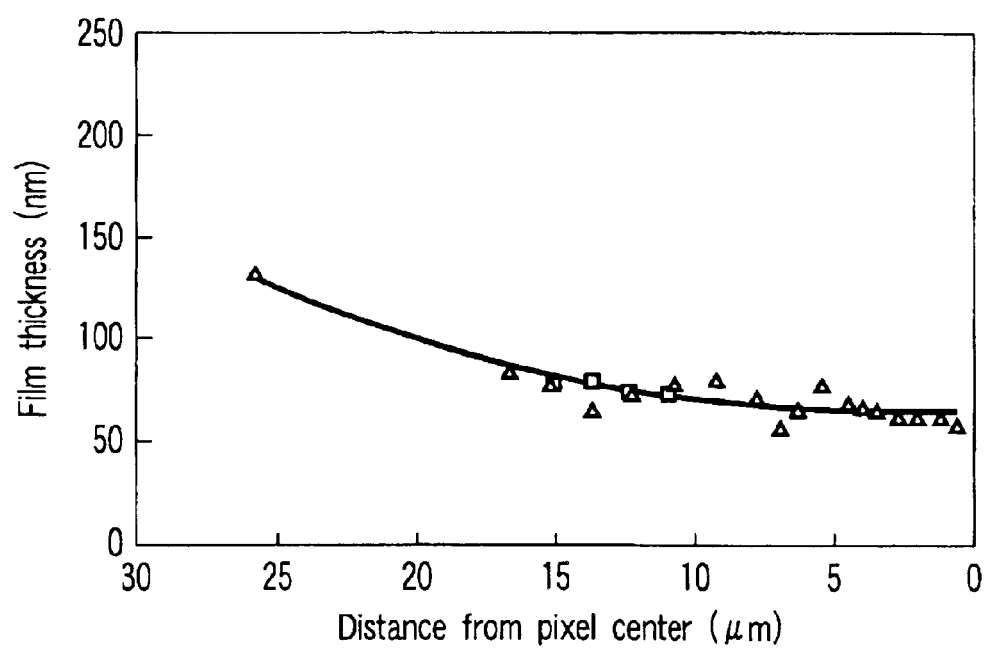
FIG. 4 is a graph showing the film thickness profile of a light-emitting layer obtained by observing a sectional SEM image of the organic EL display according to the example of the present invention.

FIG. 3 is a graph showing the film thickness profile of the buffer layer 27 obtained by observing a sectional SEM image. FIG. 4 is a graph showing the film thickness profile of the light-emitting layer 28 obtained by observing a sectional SEM image. Referring to FIGS. 3 and 4, the abscissa indicates the distance from the pixel center, and the ordinate indicates the film thickness. As shown in FIGS. 3 and 4, in the organic EL display 1 according to this example, the film thickness of the light-emitting layer 28 increases from its central portion to its periphery, whereas the film thickness of the buffer layer 27 decreases from its central portion to its periphery. That is, the organic EL display 1 according to this example has a structure capable of suppressing local current concentration to a portion of the light-emitting layer 28. When images were actually displayed by the organic EL display 1, no uneven luminance was produced in each pixel.

In this technique as has been explained above, the central portion of the buffer layer is made thicker than its periphery. Therefore, when the central portion of the organic emitting layer is thinner than its periphery, local current concentration to a portion of the organic emitting layer can be suppressed.

That is, this technique provides an organic EL element and organic EL display which can suppress local current concentration to a portion of the organic emitting layer, and in which luminance nonuniformity in an element is suppressed.

What is claimed is:

1. An organic EL display comprising:
   a substrate;
   anodes arranged on one major surface of the substrate;
   an insulating separator layer covering the major surface of the substrate and having through-holes in positions of the anodes;
   organic emitting layers disposed on the anodes;
   buffer layers disposed between the anodes and the organic emitting layers; and
   a cathode covering the organic emitting layers,
   wherein a central portion of each of the buffer layers is thicker than a periphery thereof.

2. A display according to claim 1, wherein the periphery and central portion of the buffer layer are different in composition.

3. A display according to claim 1, wherein each of the buffer layers contains a polythiophene derivative and polystyrene sulfonic acid derivative.

4. A display according to claim 3, wherein a concentration of the polystyrene sulfonic acid derivative in the central portion of the buffer layer is higher than a concentration of the polystyrene sulfonic acid derivative in the periphery of the buffer layer.

5. A display according to claim 1, wherein a central portion of each of the organic emitting layers is thinner than a periphery thereof.

6. A display according to claim 1, wherein the insulating separator layer comprises a first insulating layer disposed on the major surface of the substrate, and a second insulating layer disposed on the first insulating layer and made of a material different from a material of the first insulating layer.

7. A display according to claim 6, wherein the first insulating layer is made of an inorganic insulating material, and the second insulating layer is made of an organic insulating material.

8. A display according to claim 1, wherein each of the anodes is made of a transparent conductive material.

9. A display according to claim 1, wherein a central portion of each of the organic emitting layers is thinner than a periphery thereof, and the periphery and central portion of the buffer layer are different in composition.

10. A display according to claim 9, wherein each of the buffer layers contains a polythiophene derivative and polystyrene sulfonic acid derivative, and a concentration of the polystyrene sulfonic acid derivative in the central portion of the buffer layer is higher than a concentration of the polystyrene sulfonic acid derivative in the periphery of the buffer layer.

11. A display according to claim 1, wherein the insulating separator layer comprises an inorganic insulating layer disposed on the major surface of the substrate, and an organic insulating layer disposed on the inorganic insulating layer, and each of the anodes is made of a transparent conductive material.

12. A display according to claim 11, wherein the periphery and central portion of the buffer layer are different in composition.

13. A display according to claim 12, wherein each of the buffer layers contains a polythiophene derivative and polystyrene sulfonic acid derivative, and a concentration of the polystyrene sulfonic acid derivative in the central portion of the buffer layer is higher than a concentration of the polystyrene sulfonic acid derivative in the periphery thereof.

14. A display according to claim 13, wherein a central portion of the organic emitting layers is thinner than a periphery thereof.

15. An organic EL element comprising:
    an anode;
    a cathode facing the anode;
    an organic emitting layer disposed between the anode and cathode; and
    a buffer layer disposed between the anode and organic emitting layer, a central portion of the buffer layer being thicker than a periphery thereof.

16. An element according to claim 15, wherein the periphery and central portion of the buffer layer are different in composition.

17. An element according to claim 15, wherein the buffer layer contains a polythiophene derivative and polystyrene sulfonic acid derivative.

18. An element according to claim 17, wherein a concentration of the polystyrene sulfonic acid derivative in the central portion of the buffer layer is higher than a concentration of the polystyrene sulfonic acid derivative in the periphery of the buffer layer.

19. An element according to claim 15, wherein a central portion of the organic emitting layer is thinner than a periphery thereof.

20. An element according to claim 15, wherein the anode is made of a transparent conductive material.

* * * * *